(12) United States Patent
Chirovsky

(10) Patent No.: US 7,339,969 B2
(45) Date of Patent: Mar. 4, 2008

(54) REFINED MIRROR STRUCTURE FOR REDUCING THE EFFECT OF FEEDBACK ON A VCSEL

(75) Inventor: Leo Chirovsky, Bridgewater, NJ (US)

(73) Assignee: Optical Communication Products, Inc., Woodland Hills, CA (US)

( * ) Notice: Subject to any disclaimer, the term of this patent is extended or adjusted under 35 U.S.C. 154(b) by 37 days.

(21) Appl. No.: 11/381,773

(22) Filed: May 5, 2006

(65) Prior Publication Data
US 2007/0258501 A1 Nov. 8, 2007

(51) Int. Cl.
*H01S 5/00* (2006.01)
(52) U.S. Cl. .............................. 372/50.124; 372/43.01; 372/45.013
(58) Field of Classification Search ............. 372/43.01, 372/50.124, 45.013
See application file for complete search history.

(56) References Cited
U.S. PATENT DOCUMENTS
6,882,673 B1* 4/2005 Wasserbauer et al. ..... 372/50.1

2005/0100063 A1* 5/2005 Wasserbauer et al. ........ 372/19
2005/0117623 A1* 6/2005 Shchukin et al. ............. 372/97

* cited by examiner

Primary Examiner—Dung (Michael) Nguyen
(74) Attorney, Agent, or Firm—Barlow, Josephs & Holmes, Ltd.

(57) ABSTRACT

A VCSEL is provided that integrates an absorbing layer sandwiched within a null of the standing wave in the emitting mirror to reduce the reflectivity and transmissivity of the emitting mirror as seen by the feedback optical wave, with minimal effect on the reflectivity of the emitting mirror as seen by the light exiting the cavity. The absorbing layer may be made of a suitable absorbing material, such as a GaAs layer in a laser emitting near 850 nm or highly doped p-layer, for instance, and may be disposed epitaxially in a semiconductor or metamorphic mirror. The absorbing layer sandwich may be incorporated into the VCSEL after the last mirror pair or at any desired position with the emitting mirror array.

17 Claims, 6 Drawing Sheets

REFINED MIRROR STRUCTURE FOR REDUCING THE EFFECT OF FEEDBACK ON A VCSEL

BACKGROUND OF THE INVENTION

The present invention relates generally to optoelectronic devices for use in optical communication systems. More specifically, the present invention relates to an improved mirror structure with integrated optical feedback protection for use in a vertical cavity surface emitting laser (VCSEL), such as is typically used as an optical transmitter in optical communication systems.

It is known in the art that VCSEL devices have heightened sensitivity to some forms of optical feedback. In this regard, for the context of the present application, we define optical feedback as any light incident on the VCSEL output mirror from the outside, traveling back into the VCSEL. Initially, one would expect that since the output mirror of the VCSEL is highly reflective in both directions, usually between 99% and 99.9%, very little incident light, on the order of 1% to 0.1%, actually penetrates the mirror over the wide range of wavelengths that the mirror is highly reflective. However, the VCSEL is a resonant cavity structure that includes a volume of material sandwiched between the output or front mirror and a backside mirror, both of which are parallel highly reflective mirrors. FIG. 1a shows a graph of the reflectivity of a symmetric lossless cavity for light incident on the front mirror from the outside, where the two mirrors have identical reflectivities of about 99.5% and where lossless means no parasitic losses other than the light exiting through the two mirrors. As can be seen, the reflectivity of the whole structure is very robust at approximately 99.8% or higher over a wavelength range of almost 300 nm. The difficulty however is that for a very narrow range that exists at a fraction of a nanometer, the 0.5% portion of the incident light that does penetrate the output mirror is amplified inside the cavity due to resonance. The center of that range is called the resonant cavity wavelength (rcw). The 0.5% of the incident photons that penetrate the front mirror from the outside begin to bounce back and forth between the two mirrors in an amplification process of trapping. Only 0.5% of the incident photons that entered the cavity from the outside can exit through each mirror per pass, defined as one round trip inside the cavity. Meantime, during each pass, more externally incident light penetrates the front mirror that is also mostly trapped. This buildup of trapped incident photons continues inside the cavity until the amount leaving the cavity equals the amount entering the cavity. The amplification builds up until the light exiting through the output mirror from the cavity, being out of phase with the 99.5% reflected portion of the incident light, interferes destructively with it and completely cancels the reflection. This is seen in FIG. 1a and the expanded view of FIG. 1b as a narrow notch in the reflectivity, wherein the reflectivity of the mirror structure can be seen as going down to 0% at rcw. At the same time, the light exiting the back mirror, that is, the light transmitted through the cavity, has the intensity of the incident light. Thus the symmetric cavity structure appears to be transparent to incident light at rcw. The total cancellation of the reflection and the total transmission through the cavity, at rcw, are not the critical facts, as these are just symptomatic consequences of the more important fact that inside the cavity, the light is at least two orders of magnitude brighter at rcw than the incident light due to resonance. This means that that externally incident light on the front mirror of the symmetric cavity, at rcw, produces light inside the cavity that is about 4 orders of magnitude brighter than the light that penetrates a stand alone front mirror, per pass, or the incident light inside the mirror at a wavelength outside of the narrow notch of FIGS. 1a and 1b. Such amplified light represents a significant disturbance inside the cavity of this structure.

While comparable to the above structure, a VCSEL is different in some aspects in that it is not a symmetric cavity and it has some parasitic losses and gain. As a result, one usually will not see such manifestations of resonance for a VCSEL as is shown in FIGS. 1a and 1b. There is usually hardly any apparent transparency and the reflectivity notch is much shallower, because the back mirror reflectivity is commonly greater than the front mirror reflectivity in a VCSEL. Nevertheless, the same principles apply in that amplification usually greater than a factor of 100 at and near rcw still occurs in a VCSEL, and could be nearly a factor of 1000. As the amplification increases, the range of wavelengths over which amplification occurs (the width of the notch in FIGS. 1a and 1b) decreases. In VCSELs that notch width could be a fraction of an Angstrom. As a result, the VCSEL is essentially impervious to optical feedback except at rcw and the narrow range of wavelengths within its notch.

The difficulty arises in VCSELs, however, because in optical communication systems the most likely and perhaps the only forms of optical feedback that occur are back reflections of the VCSEL's own output, which by its very nature is at rcw. Thus a VCSEL is mostly vulnerable to feedback in the form of its own reflections and must be protected from them, despite the high reflectivity of the front mirror.

Accordingly, in fiber optic communication system applications, there are a variety of ways in which such back reflection of laser output may be generated creating the potential for interference with the operation of the VCSEL. In a typical system, the transmission signal is generated and/or received by an optical subassembly that is constructed specifically for this purpose. The optical subassembly may typically contain a light-generating device such as a semiconductor laser (a VCSEL, for instance) for transmitting a signal, a photodiode for the purpose of receiving a signal or both, should the subassembly be configured as a transceiver that both transmits and receives optical communications signals. In such fiber optic communication systems and certain other applications, this optical subassembly is also configured to couple the light that is generated by the semiconductor laser into an end face of an optical fiber. The far end of the fiber is then coupled to another transceiver or a receiver. The fiber may also have passive connectors or splices between the two subassemblies. It is in all of these couplings that reflections, which may be produced by any number of components within the optical sub-assemblies or in the fiber (such as the fiber end faces, optical lens elements, beamsplitters, polarizers optical isolators, or the connectors) may result in feedback to the laser, in the form of back reflections of the laser's own output. This is problematic because semiconductor lasers, including VCSELs, are very sensitive to this type of optical feedback, as was explained above, and their performance may be dramatically impacted by such reflection-produced feedback. For example, it is known that medium to strong feedback may give rise to relative intensity noise (RIN), power modulation or other coupled cavity effects. In general, one of the most sensitive and troublesome indicators of a back reflection problem is the increase in RIN. Thus fiber optic communication system specifications usually include the requirement that RIN should not increase appreciably in transmitter experiments where a −12 dB (~6.3%) back reflection is intentionally produced.

At this point, the discussion of back reflection effects in VCSELs needs to be divided into two separate discussions covering two different regimes. The first is where the surfaces creating back reflections are located within the coherence length of the VCSEL, and the second is where the reflecting surfaces are located beyond the coherence length. The main significance of the coherence length, L, is that interference effects occur at distances shorter than L and no longer do so at distances greater than L. The coherence length can be determined by the following equation.

$$L = \frac{\lambda^2}{n\Delta\lambda}.$$

Here $\lambda$ is the rcw, $\Delta\lambda$ is the width of the resonance notch described above, and n is the index of refraction of the medium in which the light is traveling, usually optical fiber in communication systems, where n≈1.5. For VCSELs, L is typically between 1 and 6 cm. Interference occurs when the lightwaves are mostly in phase with each other and stops when their phases become random. Obviously, L is not a sharp cutoff, but it so happens that the potentially reflecting surfaces inside the transceiver package or optical subassembly are usually at a distance from the VCSEL that is much shorter than L, and the potentially reflecting surfaces along the fiber and at the other end of the fiber are usually at a distance from the VCSEL that is much longer than L. This is a critical fact for two reasons. The first is that the design of the package is under the control of the transceiver manufacturer, but what happens in the fiber and on the other end of the fiber probably is not. The second critical fact is that the protection from optical back reflections proposed in this patent will work when phases are randomized, but may not work when the lightwaves are in phase, for reasons that will become apparent in the description that will follow. Thus the proposed protection in this patent will work for those back reflections, which the manufacturer cannot otherwise prevent without costly isolators, and may not work only for back reflections from inside the package, in which the manufacturer can incorporate additional inexpensive protection. For example, if the communications system utilizes multimode fiber, as is the case with applications using short-wave VCSELs (850 nm, for instance) and in some cases using long-wave VCSELs (1.3 µm, for instance), the coupling of the laser light into the fiber can be so configured as to couple very little of the distant back reflections, returning through the fiber back into the laser. In this regard, in the case of multimode fiber systems, building protection from feedback into the VCSEL is less critical. However, in single mode fiber systems, the coupling is essentially symmetric and since it is designed to maximize the coupling of laser light into the fiber, it tends to maximize the coupling of light from the fiber back into the laser. The only alternative solution is the much more expensive optical isolator, used with edge-emitting lasers, which requires the laser to emit light with a controlled polarization. Controlling the polarization of a VCSEL output can have performance and reliability costs, which coupled with the monetary costs of the isolator, makes the VCSEL requiring an isolator a less convincing alternative to edge-emitting lasers.

Usually, VCSEL mirrors, especially the output mirrors, are Distributed Bragg Reflectors (DBRs), comprising stacks of layers with alternating high and low indices of refraction. Each interface in the stack produces a small reflection due to the change in the index of refraction. When each layer is made a quarter of the rcw thick, all the reflections, being in phase, interfere constructively, to produce a high reflectivity, peaking at rcw. When the number of layers is large enough, the DBR reflectivity can become as large as 99% or even 99.99% at rcw, provided that there is very little to no absorption or scattering loss of light in any of the layers or interfaces. In the case of no loss, the light that is not reflected, is transmitted, that is, penetrates the mirror. In addition, as the change in index between alternating layers become larger, the range of wavelengths becomes larger, over which the reflectivity is essentially as large as it is at rcw (over hundreds of nm, for the exemplary mirror used for FIGS. 1a and 1b). Lossless DBRs are symmetric, in the sense that they have the same reflectivity, R, and transmissivity, T, whether the light is incident from one side or the other, and for both directions of incidence R+T=1, as long as the mirror remains lossless. Then, if there are some absorption losses, A, as long as they are more or less uniformly distributed, the mirror remains essentially symmetric, in the above sense, and then R+T+A=1 for both directions of incidence. However, if the absorption is all concentrated near one face, then the amount of light lost to absorption is much greater on that side than on the other, which means that R+T on the opposite side becomes much greater than on the absorber side, breaking the above-mentioned DBR symmetry. This phenomenon is the underlying principle of the invention proposed herein.

Referring to FIG. 2, it can be seen that prior art attempts were made to reduce the external-side reflectivity of the emitting mirror 18 of a VCSEL 10 by integrating an absorptive layer 28 in order to reduce the reflectivity as seen by a feedback optical wave. Typically, the VCSEL 10 included a lower mirror 14 formed above a substrate 12, an optical cavity 16 formed above the lower mirror and an upper mirror 18 formed above the optical cavity 16. The upper mirror 18 of this device was a hybrid mirror, having a semiconductor portion 20 and a dielectric portion 22. The device further included a current confinement implant 24 as well as a current constriction 26 for mode control and defining individual devices on a wafer.

The dielectric portion 22 of the hybrid mirror comprised alternating one-quarter wavelength thick layers of a high index of refraction dielectric material and a low index of refraction dielectric material. In this approach, an absorptive titanium layer 28 was formed at the low-to-high index transition closest to the emitting facet. In this embodiment, the titanium layer 28 was processed to remove it from within the aperture formed by an upper ohmic contact 30 to reduce the absorption losses as seen from the cavity. The difficulty encountered with this approach, however, is that it provides little to no absorption of the optical feedback as seen from the external cavity. In particular, the large number of longitudinal modes that appear in the transmission spectrum due to the external cavity is not reduced.

In an attempt to overcome this absorption loss problem, U.S. Pat. No. 6,882,673, the entire contents of which are incorporated herein by reference, discloses that if the absorption layer is made very highly absorbing, but very thin, it can be placed in the DBR structure, not only near the medium and far from the cavity, but also at a null of the cavity standing wave, which means that very little of the internal laser light, will actually encounter the absorption. Its absorption contribution will then be made even smaller, but the absorption of the fed back light will not be affected as long as it is incoherent, since that light is then not in the form of a standing wave and has no positional null. As is shown in FIG. 3, an absorption layer 28a is provided in between a pair of mirror layers in the emitting mirror 22a and ultimately comprises three layers that are incorporated into the VCSEL 10 structure in place of the last mirror pair.

While this prior art approach has been effective in reducing the amount of feedback that enters the optical cavity, this solution also has difficulties. In particular, what is not provided in the prior art is a method of providing a laser with a mirror structure that produces an η (the laser's LI slope), as large as the one obtained with an emitting mirror without the feedback protection. As a result, it is possible that while a VCSEL may include the desired feedback protection, it may not be able to meet other device performance requirements, such as specifications set on η, output power, threshold current, etc.

There is therefore a need for a unique VCSEL construction that includes feedback protection while also allowing the VCSEL structure to be tuned to accommodate specifications having a set η, a particular power output requirement or a particular threshold current.

BRIEF SUMMARY OF THE INVENTION

In this regard, the present invention provides an improved performance VCSEL having an emitting mirror that reduces the effect of optical feedback through the use of a refined emitting mirror structure that allows the desired light output (L) versus bias current (I) slope to be obtained.

In one aspect of the present invention a vertical cavity surface emitting laser includes an optical cavity adjacent a first mirror, an emitting mirror adjacent the optical cavity, a mode defining aperture for controlling transverse modes and an absorbing region integrated into the layers of the emitting mirror, wherein the absorbing region locks the absorbing layer in a standing wave null. The absorption region has a half-wave thick $n_{lo}$ layer, a quarter-wave thick $n_{hi}$ layer, an absorption layer, another half-wave thick $n_{lo}$ layer and another quarter-wave thick $n_{hi}$ layer. In another aspect of the present invention a vertical cavity surface emitting laser includes an absorbing region as is disclosed above wherein the absorbing regions is placed within the structure of the emitting mirror such that there are several mirror pairs both above and below the absorbing region.

It is therefore an object of the present invention to provide a solid state laser construction that includes an absorbing layer for protection against optical feedback such as typically results from optical coupling while also allowing adjustments in the mirror structure with minimal increase in parasitic losses. This together with other objects of the invention, along with various features of novelty which characterize the invention, are pointed out with particularity in the claims annexed hereto and forming a part of this disclosure. For a better understanding of the invention, its operating advantages and the specific objects attained by its uses, reference should be had to the accompanying drawings and descriptive matter in which there is illustrated a preferred embodiment of the invention.

BRIEF DESCRIPTION OF THE DRAWINGS

In the drawings which illustrate the best mode presently contemplated for carrying out the present invention.

DETAILED DESCRIPTION OF THE INVENTION

Figure 1A:
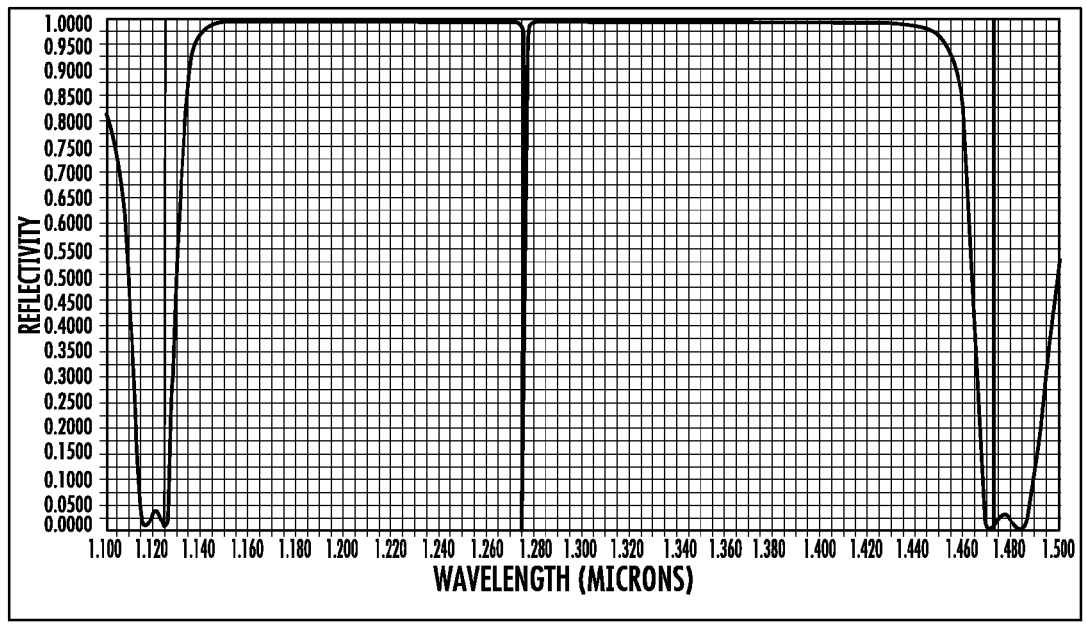
FIGS. 1a and 1b depict the reflectivity of a simulated lossless symmetric cavity.
Figure 1B:
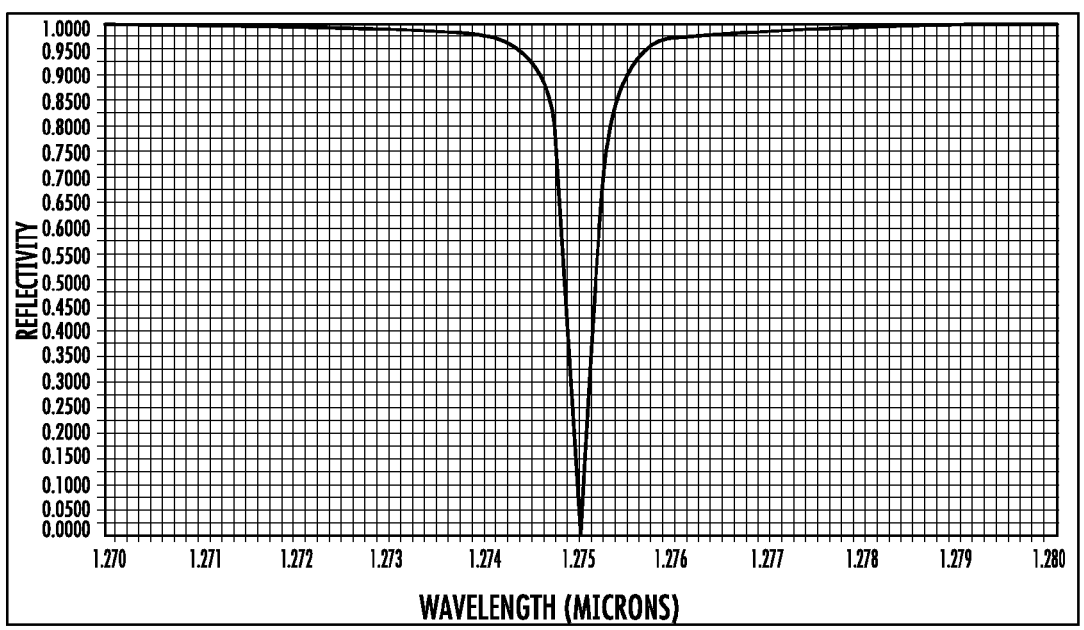
Figure 2:
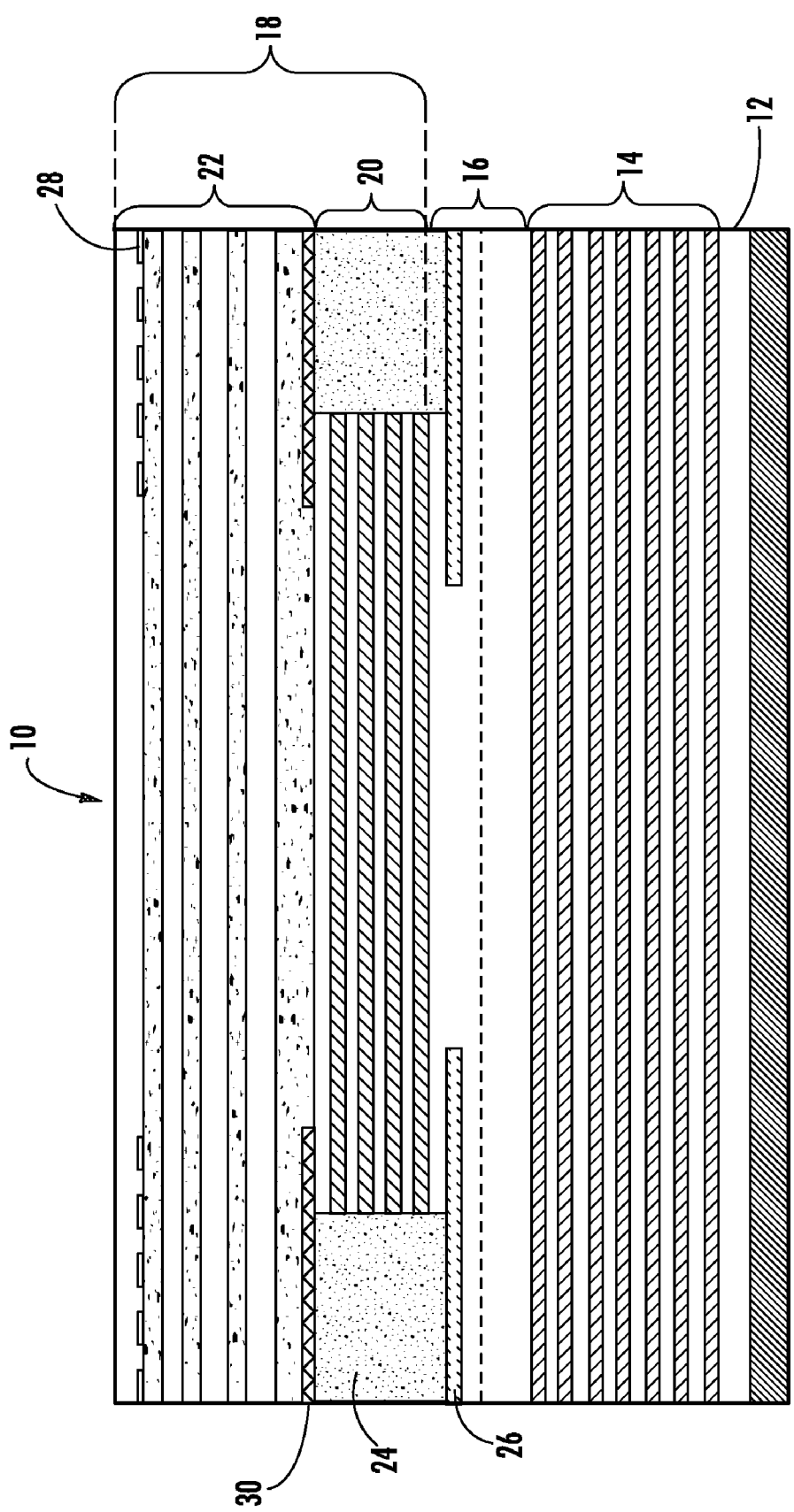
FIG. 2 is a cross sectional view of a prior art VCSEL having an absorbing layer integrated in the emission mirror outside the aperture formed by the upper ohmic contact.
Figure 3:
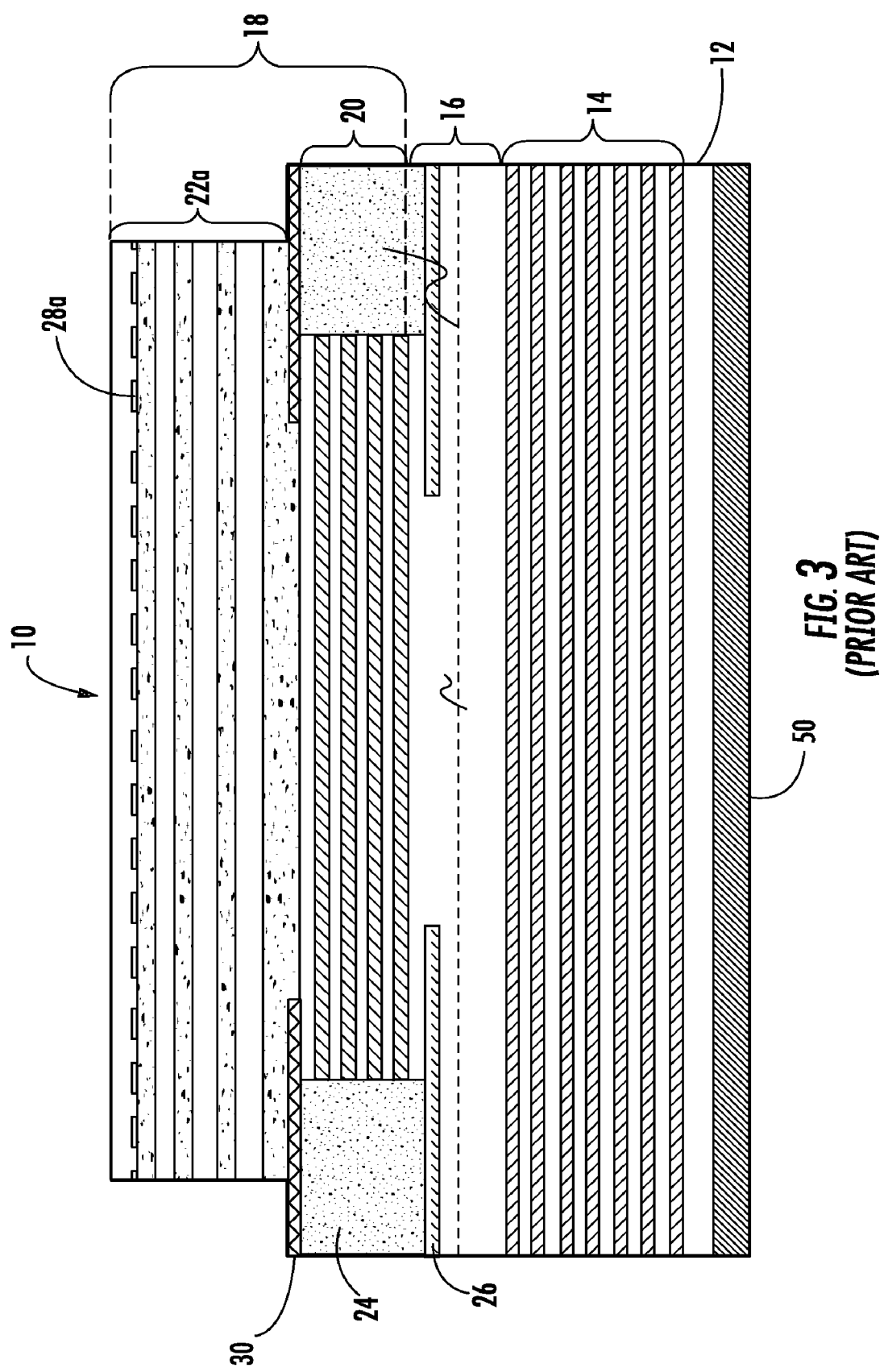
FIG. 3 is a cross sectional view of a prior art VCSEL having an absorbing layer integrated in the emission mirror formed over the entire area of the emission mirror.
Figure 4:
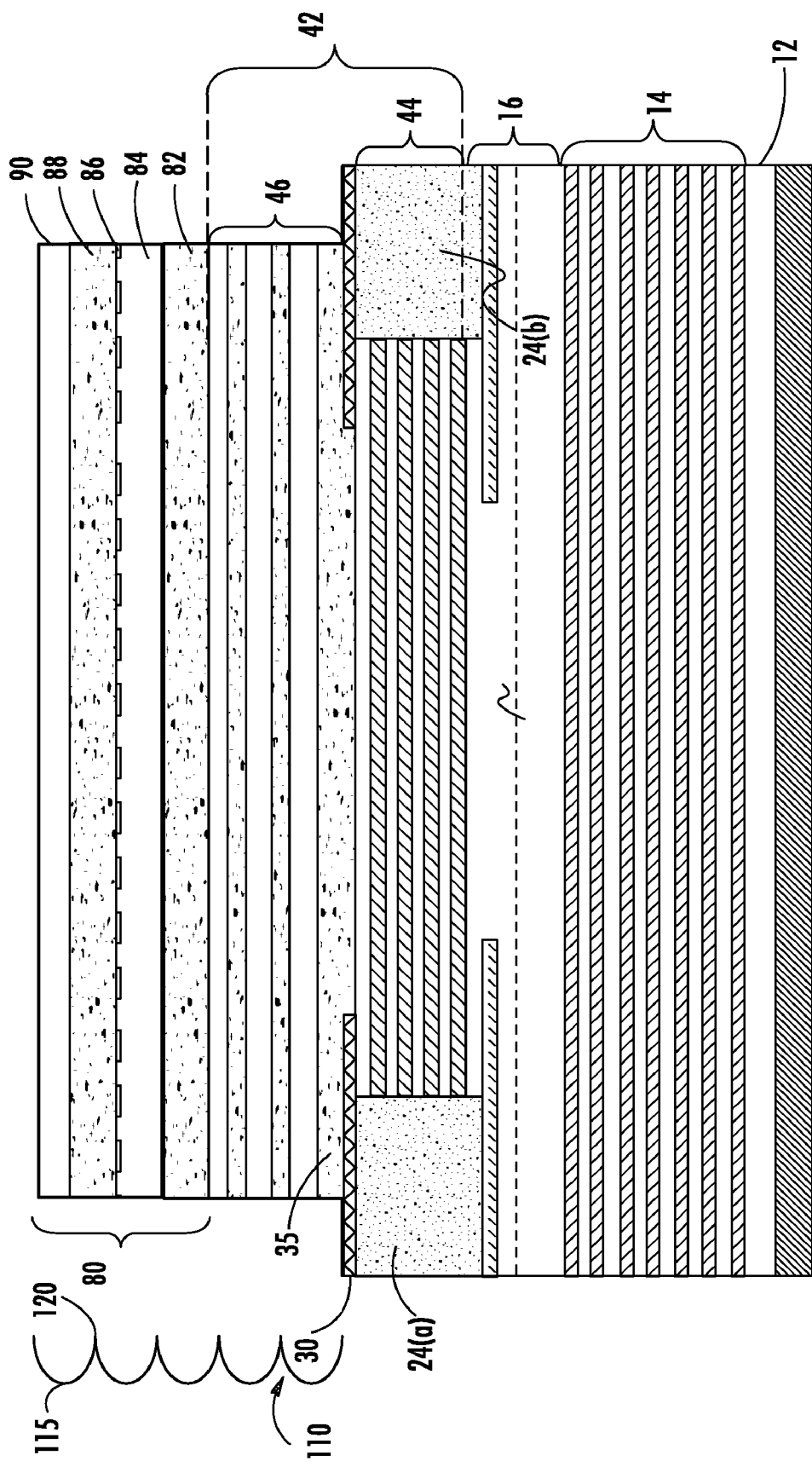
FIG. 4 is a cross sectional view of a VCSEL having an absorbing structure integrated adjacent a top layer of the emitting mirror in accordance with an exemplary embodiment of the present invention.

Now referring to the drawings, an exemplary embodiment of the present invention is illustrated in FIG. 4, wherein an absorbing structure 80 that includes an absorbing layer 86 is provided and integrated adjacent the top surface of the emitting mirror 42 of an exemplary VCSEL. The absorbing structure 80 functions to reduce the reflectivity and transmissivity of the emitting mirror 42 as seen by a feedback optical wave. Generally, the absorbing structure 80 is configured to include two pairs of alternating layers of aluminum gallium arsenide (AlGaAs) and aluminum arsenide (AlAs), with varying concentrations of aluminum or any other suitable pairs of materials having suitably high and low indices of refraction. Preferably, as will be described in detail below, the absorbing structure 80 is formed from a first layer of low index material 82 having a thickness equal to a half wavelength of the emitted light, a first layer of high index material 84 having a quarter wavelength thickness, an absorbing layer 86, a second layer of low index material 88 having a half wavelength thickness and a second layer of high index 90 material having a quarter wavelength thickness. The absorbing layer 86 may be made of a suitable semiconductor material. For example, a narrow bandgap GaAs layer may be used as an absorbing layer 86 in a laser emitting near 850 nm or a highly doped p-type semiconductor layer. The absorbing layer 86 may be disposed epitaxially in a semiconductor or metamorphic mirror. Alternatively, a metal layer, such as titanium or any other suitable metallic material, may be disposed in the dielectric portion of a hybrid mirror or an all-dielectric mirror.

In an exemplary embodiment of the present invention, the absorbing structure 80, such as for example 200 Angstroms of Ti disposed between the two pairs of alternating layers of high and low index material, may be integrated over at least a portion of the mode defining aperture, directly in the path of the exit beam. In this embodiment, the absorbing structure 80 not only reduces the Q of the external cavity, which reduces power modulation, but also reduces the number of external cavity-generated longitudinal modes, and may therefore also reduce RIN. It is appreciated that conventionally, absorptive layers located in the optical path of the beam are generally avoided because such positioning reduces the efficiency of the device. However, in an exemplary embodiment of the present invention the absorbing layer 86 is located within the absorbing structure 80 in such a manner that the absorbing layer 86 is locked in a standing wave null that is formed by the layers of the absorbing structure 80 itself. Therefore, the described exemplary embodiment may substantially increase absorption as seen by incoherent light from the external feedback side with a relatively small increase in absorption as seen from the VCSEL cavity. Furthermore, since the absorption structure 80 itself provides the correct positioning of the absorption layer 86 relative to the output wave pattern, the absorption layer 86 can be positioned in a variety of highly desirable locations throughout the emitting mirror 42 to adjust the output characteristics of the VCSEL as will be described in more detail below. At this point it should be mentioned that if the feedback light is still coherent (is back-reflected from a surface closer than a coherence length from the VCSEL) that light might also encounter the absorbing layer at its null and therefore experience a relatively small increase in absorption. In such a case the feedback protection will not succeed.

One of skill in the art will appreciate that the present invention is not limited to particular material systems or emission wavelengths. Rather, the compound semiconductor layers of the described exemplary light-emitting devices may be formed from a variety of group III-V or II-VI compound semiconductors, such as, for example, GaAs/AlGaAs, InGaAs/AlGaAs or InP/InGaAsP or other direct bandgap semiconductor materials. Further, while the advantages of the present invention may be best understood in the context of an exemplary VCSEL, the VCSEL as illustrated in FIG. 4 is intended only to illustrate one of the possible applications for the absorption structure 80 of the present invention. One skilled in the art can appreciate that the teachings of the present invention are equally applicable with respect to any other type VCSEL construction. Accordingly, turning again to FIG. 4, the exemplary VCSEL may include a substrate 12, a lower mirror 14, an optical cavity 16 and an upper mirror 42. As is commonly known in the art, an exemplary substrate may comprise gallium arsenide (GaAs) or any other suitable material. The lower mirror 14 may comprise a multi-layered distributed Bragg reflector, (DBR) as is conventional in the art. An exemplary embodiment of the present invention may include a semiconductor upper mirror, a dielectric upper mirror or a hybrid upper mirror having semiconductor mirror layers 44 and dielectric mirror layers 46 as illustrated in FIG. 4.

An exemplary VCSEL may be formed into discrete lasers by a combination of current confinement and ohmic contacts. Current constriction may be achieved by implanting ions at multiple energies as is known in the art. Implantation regions 24(*a*) and 24(*b*) convert the semiconductor mirror layers 44 of the hybrid mirror to a high resistivity region. The encircling high resistance region forms a funnel to provide current confinement as is known in the art. Other techniques for current constriction, such as selective AlAs oxidation, are also applicable.

The upper ohmic contact 30 is disposed above the optical cavity and in an exemplary embodiment may be formed adjacent the upper semiconductor mirror layers 44. The top ohmic contact 30 creates an ohmic aperture inside the aperture formed by the ion implant regions 24(*a*) and 24(*b*), to provide a ring contact. In the described exemplary embodiment the top ohmic contact 30 may be a p-type ohmic contact and may be, for example, gold with 2% beryllium added or a layered structure of titanium/platinum/gold, preferably deposited by electron beam evaporation. In accordance with an exemplary embodiment, the upper ohmic contact 30 may also function as a mode-defining aperture restricting emission to a single transverse mode. One of skill in the art will appreciate however that a current constriction in the form of an ion implant or oxide aperture may also be utilized as a mode-defining aperture to provide single or multi-mode emission.

The bottom of the substrate may include a contact metalization, forming a lower ohmic contact 50. In one embodiment the lower ohmic contact may be an n-type ohmic contact and may be, for example, eutectic gold germanium deposited by electron beam evaporation or sputtering. In the described exemplary embodiment, current flows from the upper ohmic contact 30 down through the current funnel, into the optical cavity where it recombines with opposite conductivity type carriers flowing up from the lower ohmic contact 50. The recombination in the optical cavity is a composite of spontaneous and stimulated emission, whereby the stimulated emission exits the device out the top surface via the aperture in the upper ohmic contact. One of skill in the art will appreciate that there are a plurality of suitable VCSEL structures, which may be used to practice the present invention. Therefore the disclosed VCSEL structure is by way of example only and not by way of limitation.

Figure 5:
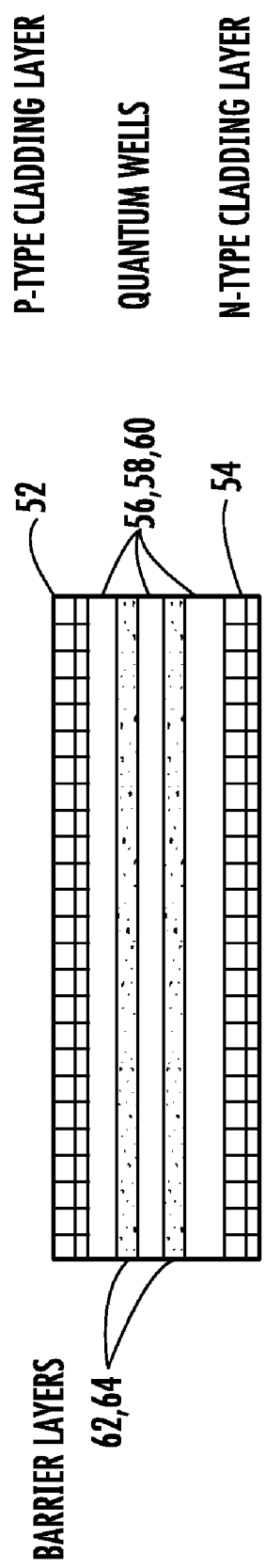
FIG. 5 is a cross sectional view of an exemplary multi-quantum well optical cavity.

Referring to FIG. 5, the optical cavity 16 in accordance with an exemplary embodiment of the present invention may include an active region surrounded by first and second cladding regions 52 and 54. In the described exemplary embodiment the first and second cladding regions 52 and 54 may comprise AlGaAs. The active region may comprise a plurality of quantum wells 56, 58, and 60, with barrier layers 62 and 64 there between. In the described exemplary embodiment the quantum wells 56, 58, and 60 may comprise GaAs and the adjacent barrier layers 62 and 64 may comprise $Al_x Ga_{1-x} As$. Additionally, it is generally understood in the art that the materials forming the quantum wells and surrounding barrier layers may be varied depending on the design. Therefore, the disclosed optical cavity is by way of example and not by way of limitation.

Referring back to FIG. 4, in an exemplary embodiment, the lower mirror 14 and the semiconductor mirror layers 44 of the hybrid upper mirror 42 may comprise alternating layers of aluminum gallium arsenide (AlGaAs) and aluminum arsenide (AlAs), with varying concentrations of aluminum. In an exemplary embodiment the upper and lower semiconductor mirror layers may be doped of opposite conductivity types. The optical thickness of each mirror layer is typically designed to be a quarter wavelength of the emitted light of the laser where the optical thickness is given by the product of the physical thickness and the index of refraction. Similarly, the dielectric mirror layers 46 of the hybrid mirror 42 may comprise alternating one-quarter wavelength layers of silicon nitride and silicon dioxide or other suitable dielectric materials. The alternating layers of the dielectric mirror 46 may be patterned either by etching or liftoff processes known to those skilled in the art.

In the described exemplary embodiment a dielectric spacer layer 35 may be integrated between the semiconductor mirror layers 44 and the dielectric mirror layers 46 to maintain the correct phase between the two portions of the hybrid mirror 42. The optical thickness of the dielectric spacer layer 35 may be chosen such that the maxima of the standing wave pattern 115, in both the semiconductor 44 and dielectric 46 portions of the mirror 42, appear at the high-to-low index transitions as seen from the optical cavity. This also ensures that the nulls in the standing wave pattern are located at the low-to-high index transitions as seen from the cavity.

In the described exemplary embodiment of the present invention an absorbing structure 80 is shown as being formed adjacent the top facet of the hybrid mirror 42. Further, the absorbing structure 80 may be integrated into the dielectric layers of the hybrid upper or emitting mirror 42. The described exemplary absorbing structure 80 extends across the entire ohmic aperture to provide maximum reflectivity as measured from the cavity side of the upper mirror and maximum absorption as measured from the external side of the upper mirror. However, it is also possible that the lateral extent of the absorbing structure 80 may be limited to extend across only a portion of the ohmic aperture. As stated above, the absorbing structure 80 is formed to include five layers, first layer of low index material 82 having a thickness equal to a half wavelength of the emitted light, a first layer of high index material 84 having a quarter wavelength thickness, an absorbing layer 86, a second layer of low index material 88 having a half wavelength thickness and a second layer of high index material 90 having a quarter wavelength thickness.

As can be seen in FIG. 4, a standing wave pattern 110 is shown superimposed alongside the upper mirror 42 and absorbing structure 80. It can be seen that the absorbing layer 86 within the absorbing structure 80 is positioned such that the absorbing layer 86 falls at a standing null 120 in the standing wave pattern 110. The axial standing wave intensity corresponds to the intensity of the light in the VCSEL relative to the vertical position within the device. Hence, the standing wave maxima are where the light is most intense, and the standing wave minima are where the light is least intense. Therefore, optical loss and optical scattering of the emitted light is reduced by placing the absorptive layer 86 at or near an axial standing-wave null 120.

It is important to note that the use of the absorption structure 80 as is provided in the disclosure of the present invention allows for the absorption layer 86 to be locked into a position wherein it always falls as a null 120 in the standing wave 110. This allows the absorption layer 86 to be located at any desired location within the emitter mirror 42 in a manner that allows the various performance characteristics of the VCSEL to be adjusted. In other words, the principal issue in tuning the performance characteristics of a VCSEL is obtaining a desired slope ($\eta$) in the light output (L) versus bias current (I) or LI curve for the VCSEL with minimal degradation of the threshold current. This slope, $\eta$, has units of mW/mA and is proportional to the transmission through the emitting mirror, $T_1$, divided by the total loss in the VCSEL. The total loss is the sum of the round trip parasitic loss in the VCSEL structure, 2L, plus $T_1$ and $T_2$, the transmission through the back mirror. Thus the slope is defined by the following equation:

$$\eta \propto \frac{T_1}{(T_1 + T_2 + 2L)}.$$

Typically in a VCSEL, the two mirrors are Distributed Bragg Reflectors (DBRs), comprising a stack of layer pairs, with different indices of refraction, $n_{hi}$ and $n_{lo}$, where each layer is a quarter-wave thick, $\lambda/4n_i$ (i=hi or lo), and where $\lambda$ is the desired emission wavelength of the VCSEL, rcw. The reflectivity, R, of a given DBR is determined by the relation:

$$R = \tanh^2\left(\frac{1}{2}\ln\frac{n_{m1}}{n_{m2}} + N \cdot \ln\frac{n_{hi}}{n_{lo}}\right),$$

where N is the number of layer pairs and $n_{m1}$ and $n_{m2}$ are indices of the materials under and above the given DBR. In addition, for a DBR, the sum of the reflectivity, R, the transmission, T, and the amount of absorption loss, A, must equal 1, that is, $$R+T+A=1.$$

The absorption loss, A, must be determined independently, and then once the reflectivity, R, is determined from the above equation for R, the value for T is established by the equation just above. In a typical well-designed VCSEL, which needs a strongly resonant cavity, $T_1$ and 2L are a fraction of a percent and $T_2$ is near zero or about an order of magnitude smaller. Meantime the absorption in each mirror contributes to the parasitic loss, 2L.

For a DBR, in which there are no absorbing layers (where A=0), the reflectivity and the transmission are the same for light incident from either side of the mirror (from above or below). Accordingly, one can take advantage of the fact that A and therefore R and T can be quite different for light incident from below the DBR, than for light incident from above, once there is an absorbing layer in the DBR structure. An absorption layer placed in the DBR very near the medium side will absorb far more incoherent light, incident from the medium, such as fed-back light, and will absorb far less laser light incident from the cavity. Thus the absorption contribution to the total VCSEL loss, 2L, which degrades VCSEL performance, will be small while the absorption of incoherent fed-back light will be large.

Figure 6:
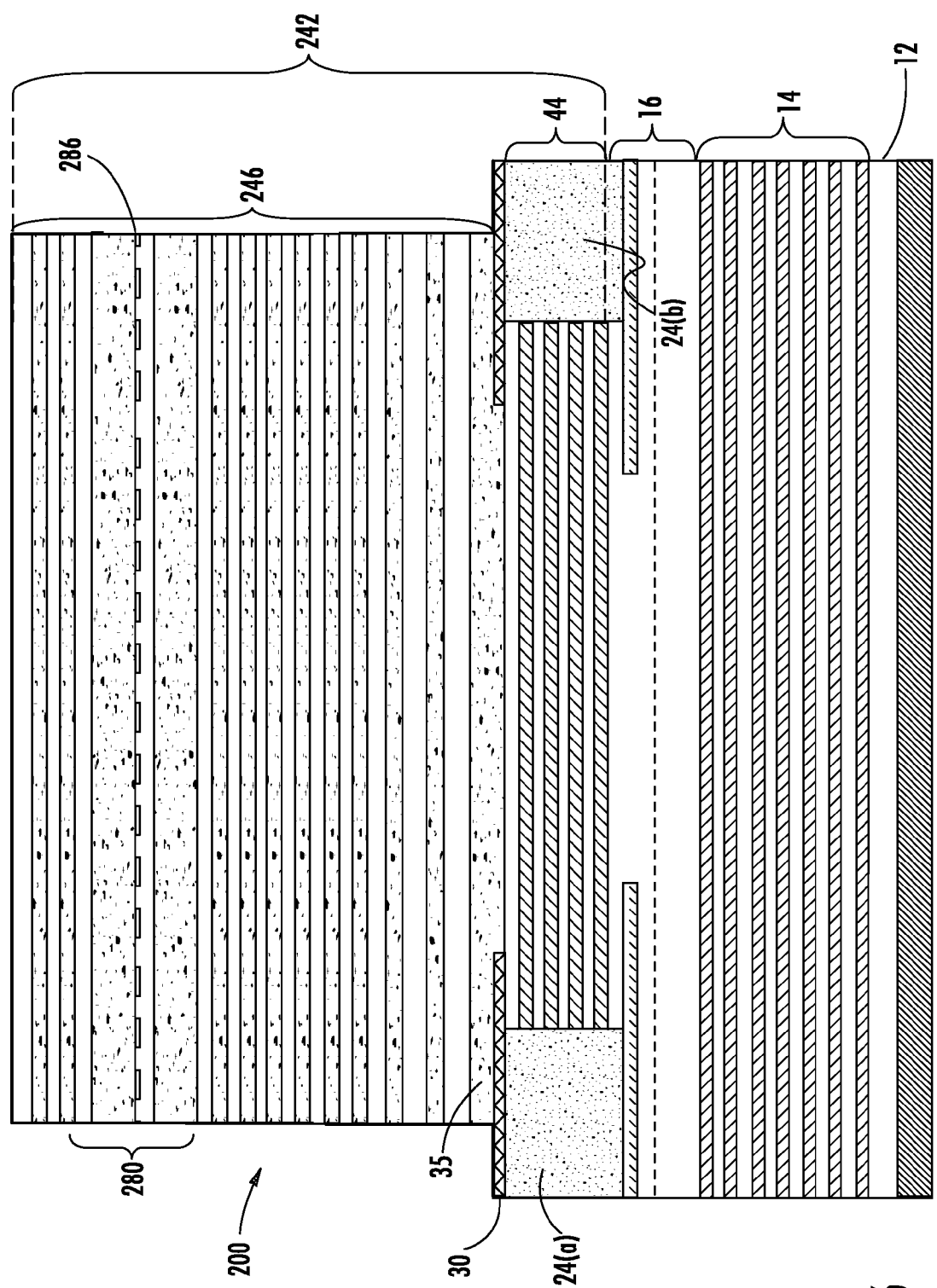
FIG. 6 is a cross sectional view of a VCSEL having an absorbing structure integrated between mirror periods within the emitting mirror in accordance with an alternate exemplary embodiment of the present invention.

In this regard the use of the absorption structure 80 of the present invention creates a structure for a feedback protection while also allowing adjustments of $T_1$ with minimal changes in 2L so that a desired $\eta$ can be obtained, with much smaller increases in threshold current. Turning to FIG. 6, an alternate VCSEL structure is shown as 200 wherein the upper mirror 242 shows the absorbing structure 280 as being incorporated within the mirror structure itself. This particular VCSEL 200 illustrates that the adjustments in $T_1$ can be made in three ways, listed from coarser to finer. They are changes in the number of DBR pairs beneath the absorption structure 280, the number of DBR pairs above the absorption structure 280, and fine adjustments of the thicknesses of the last layer beneath the absorption structure 280 or the last layer adjacent the medium. These adjustments are possible, because the proposed absorption structure 280 essentially locks the absorption layer 286 in a standing wave null as described above. In one preferred embodiment, nine dielectric DBR pairs are provided below the absorption structure 280 while three dielectric DBR pairs are provided above the absorption structure 280. It can be appreciated however that this is only an illustration and one skilled in the art would appreciate that any positioning of the absorption structure 280 within the emitting mirror would remain within the teachings of the present invention.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention.

For example, the described exemplary light emitting devices may be manufactured in the form of arrays, wherein the devices are epitaxially grown on a single substrate, processed and auto-tested as a whole wafer. Conventionally, individual devices within an array may be defined by implanting protons in the form of an annular isolation region that confines current flow within the individual VCSEL devices, while also electrically isolating each device from the other VCSEL devices in the array. However, in the case of long wavelength VCSELs, the thickness of the upper mirror may exceed the maximum depth to which hydrogen or other ions may be reasonably implanted. In these instances mesas may be formed to isolate individual devices on the wafer.

The invention itself herein will further suggest solutions to other tasks and adaptations for other applications to those skilled in the art. It is therefore desired that the present embodiments be considered in all respects as illustrative and not restrictive, reference being made to the appended claims rather than the foregoing description to indicate the scope of the invention.

What is claimed is:

1. A vertical cavity surface emitting laser, comprising:
   an optical cavity adjacent a first mirror;
   an emitting mirror formed form a plurality of mirror periods adjacent said optical cavity;
   a mode defining aperture for controlling transverse modes; and
   an absorbing structure integrated with the emitting mirror,
   wherein said absorbing structure is laterally located within at least a portion of said mode defining aperture, and
   wherein said absorbing structure includes an absorbing layer positioned between an alternating series of low index and high index layers at or near a null in the standing optical wave pattern such that said absorbing structure can be positioned between any of the plurality of mirror periods in the emitting mirror so as to strongly interact with external light reflected back into the cavity.

2. The vertical cavity surface emitting laser of claim 1, said absorbing structure comprising:
   a first half-wave thick low index layer;
   a first quarter-wave thick high index layer;
   the absorption layer;
   a second half-wave thick low index layer; and
   a second quarter-wave thick high index layer.

3. The vertical cavity surface emitting laser of claim 1, wherein said absorbing structure is adjacent the top surface of said emitting mirror.

4. The vertical cavity surface emitting laser of claim 1, wherein said absorbing structure is positioned within said emitting mirror between two of said plurality of said mirror periods.

5. The vertical cavity surface emitting laser of claim 4, wherein said absorbing structure is positioned within said emitting mirror wherein 9 mirror periods are below said absorbing structure and 2 mirror periods are above said absorbing structure.

6. The vertical cavity surface emitting laser of claim 1, wherein said absorbing layer is a layer of conductive material.

7. The vertical cavity surface emitting laser of claim 6 wherein said conductive material is titanium.

8. The vertical cavity surface emitting laser of claim 1 wherein said absorbing layer is a layer of semiconductor material.

9. The vertical cavity surface emitting laser of claim 8 wherein said semiconductor material is doped p-type.

10. The vertical cavity surface emitting laser of claim 8 wherein the semiconductor material is a narrow bandgap material, and wherein an absorption edge of said semiconductor material is at a longer wavelength than emission wavelength of said vertical cavity surface emitting laser.

11. The vertical cavity surface emitting laser of claim 1 wherein said plurality of mirror periods in said emitting mirror comprises a DBR.

12. A vertical cavity surface emitting laser, comprising:
    an optical cavity adjacent a first mirror;
    an emitting mirror formed form a plurality of mirror periods adjacent said optical cavity; and
    an absorbing structure formed adjacent a top surface of said emitting mirror,
    wherein said absorbing structure includes an absorbing layer positioned between an alternating series of low index and high index layers at or near a null in the standing optical wave pattern such that said absorbing structure can be positioned between any of the plurality of mirror periods in the emitting mirror so as to strongly interact with external light reflected back into the cavity.

13. The vertical cavity surface emitting laser of claim 12, said absorbing structure comprising:
    a first half-wave thick low index layer;
    a first quarter-wave thick high index layer;
    the absorption layer;
    a second half-wave thick low index layer; and
    a second quarter-wave thick high index layer.

14. A vertical cavity surface emitting laser, comprising:
    an optical cavity adjacent a first mirror;
    an emitting mirror formed form a plurality of mirror periods adjacent said optical cavity; and
    an absorbing structure integrated within the emitting mirror,
    wherein said absorbing structure includes an absorbing layer positioned between an alternating series of low index and high index layers at or near a null in the standing optical wave pattern such that said absorbing structure can be positioned between any of the plurality of mirror periods in the emitting mirror so as to strongly interact with external light reflected back into the cavity.

15. The vertical cavity surface emitting laser of claim 14, said absorbing structure comprising:
    a first half-wave thick low index layer;
    a first quarter-wave thick high index layer;
    the absorption layer;
    a second half-wave thick low index layer; and
    a second quarter-wave thick high index layer.

16. The vertical cavity surface emitting laser of claim 1, wherein said absorbing structure is positioned within said emitting mirror between two of said plurality of said mirror periods.

17. The vertical cavity surface emitting laser of claim 16, wherein said absorbing structure is positioned within said emitting mirror wherein 9 mirror periods are below said absorbing structure and 2 mirror periods are above said absorbing structure.

* * * * *